(12) United States Patent
Kim et al.

(10) Patent No.: US 6,456,517 B2
(45) Date of Patent: Sep. 24, 2002

(54) SYSTEM HAVING MEMORY DEVICES OPERABLE IN A COMMON INTERFACE

(75) Inventors: Tae-Kyun Kim; Sei-Jin Kim; Dae-Soo Jung, all of Kyungki-do (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/771,307

(22) Filed: Jan. 26, 2001

(30) Foreign Application Priority Data

Jan. 26, 2000 (KR) .......................................... 2000-03708

(51) Int. Cl.[7] .............................................. G11C 16/06
(52) U.S. Cl. ...................... 365/51; 365/63; 365/189.05; 365/189.07
(58) Field of Search ....................... 365/51, 63, 189.07, 365/189.05, 230.08

(56) References Cited

U.S. PATENT DOCUMENTS 4,713,756 A * 12/1987 Mackiewicz et al. ....... 364/200
5,663,901 A * 9/1997 Wallace et al. ............... 365/52
6,108,236 A * 8/2000 Barnett ................... 365/185.09

OTHER PUBLICATIONS

Samsung Electronics MOS Memory Data Book; CMOS DRAM; pp. 559–574 (1995).
Samsung Electronics SRAM FIFO Data Book; CMOS FIFO; pp. 641–654 (1995).
Samsung Electronics Flash Memory Data Book; Preliminary Flash Memory; pp. 101–110; (1998).

* cited by examiner

Primary Examiner—Son T. Dinh
(74) Attorney, Agent, or Firm—Marger Johnson & McCollom, P.C.

(57) ABSTRACT

DRAM and SRAM devices have a NAND interface mode (pins whose address and data are identical to one another are commonly used), directly being coupled to buses (an address/data bus and a control bus) of a NAND-type flash memory device that is connected to a microprocessor. Upon such a common interface mode, a DRAM device, an SRAM device, a NAND-type flash memory device, and a NOR-type flash memory device have the identical interface mode, and are independently (or individually) controlled by only one memory controller.

19 Claims, 10 Drawing Sheets

SYSTEM HAVING MEMORY DEVICES OPERABLE IN A COMMON INTERFACE

CROSS REFERENCE TO RELATED APPLICATIONS

This application relies for priority upon Korean Patent Application No. 2000-03708, filed on Jan. 26, 2000, the contents of which are herein incorporated by reference in their entirety.

FIELD OF THE INVENTION

The present invention relates to electrical devices and, more particularly, to a system having memory devices operable in a common interface.

BACKGROUND OF THE INVENTION

Recently various memory devices are being employed in computer- or microprocessor-based systems. Such systems require data storage elements, such memories. These memories include volatile semiconductor memory devices, e.g. dynamic random access memory devices (DRAMs) and static random access memory devices (SRAMs), and non-volatile semiconductor memory devices, e.g. NAND-type flash memory devices and NOR-type flash memory devices. The volatile and non-volatile semiconductor memory devices are controlled by their corresponding memory controllers. Such memory controllers are disclosed in U. S. Pat. Nos. 5,684,978, and 5,893,136.

As well known in the art, DRAM and SRAM devices adopt an interface mode where address pins are separated from data pins, while a NAND-type flash memory device adopts an interface mode (i.e., "multiplexing interface mode") where address pins are commonly used with data pins. The above NAND-type flash memory device is disclosed in a data book "Flash Memories" published in Samsung Electronics Co., Ltd., March 1998. The above DRAM device is disclosed in a data book "MOS Memory" published by Samsung Electronics Co., Ltd., 1995. And, the above SRAM device is disclosed in a data book "SRAM/FIFO" published in Samsung Electronics Co., Ltd., April 1995.

A conventional system is schematically shown in FIG. 1 The system includes a microprocessor 1 (or a central processing unit, a baseband modem of a communication terminal, a codec, etc.), a DRAM device 2, an SRAM device 3, and a NAND-type flash memory device 4. The microprocessor 1 includes memory controllers 5, 6, and 7 that control the DRAM device 2, the SRAM device 3, and the NAND-type flash memory device 4, respectively. The memory controller 5 for the only DRAM device transfers address and control signals to the DRAM device 2 through a corresponding bus 15. The memory controller 6 for the only SRAM device transfers address and control signals to the SRAM device 3 through a corresponding bus 16. And the memory controller 7 for the NAND-type flash memory device transfers address and control signals to the NAND-type flash memory device 4 through a corresponding bus 17.

Since memory devices used in a system have pin arrangements and interface modes that are different from each other, a memory controller must be provided for each of memory devices 2, 3, 4, to the microcontroller 1, as can be seen in FIG. 1. This causes increase in a size of the microcontroller 1. In addition, memory devices having pin arrangements and interface modes that are different from each other cannot be mounted together within a single chip-size package (CSP).

SUMMARY OF THE INVENTION

It is therefore an object of the present invention to provide a system having NAND interface DRAM, SRAM, and NOR-type flash memory devices which are commonly connected to one bus.

It is another object of the present invention to provide a NAND-type flash memory device having an SRAM interface mode.

It is further another object of the present invention to provide a NAND-type flash memory device capable of enhancing a bus use efficiency.

A semiconductor memory device includes a random access memory chip, and a package containing the random access memory chip. The package includes a plurality of pins for electrically connecting the random access memory chip to an external device.

According to one aspect of the present invention, the pins provide memory functions commonly to a random access memory device, and also to an electrically erasable and programmable non-volatile semiconductor memory device. Each of the pins is arranged at a position of a pin corresponding to the non-volatile semiconductor memory device.

According to another aspect of the present invention, the pins include a first group of pins and a second group of pins. The pins of the first group provide memory functions commonly to a static random access memory device and also to an electrically erasable and programmable non-volatile semiconductor memory device. And the pins of the first group are arranged at positions of corresponding pins of the static random access memory device, respectively. The pins of the second group provide functions of unused non-volatile semiconductor memory device to the static random access memory. The pins of the second group are arranged at a position of an unused pin of the static random access memory, respectively.

DESCRIPTION OF THE PREFERRED EMBODIMENT

The present invention will now be described more fully hereinafter, with reference to accompanying drawings wherein preferred embodiments of the invention are illustrated.

The present invention provides pin arrangements, structures, and a method of operating DRAM, SRAM, and NAND-type flash memory devices. The DRAM and SRAM devices have a NAND interface mode (pins whose address and data are identical to each other are used), being directly coupled to buses (an address/IO bus and a control bus) of a NAND-type flash memory device, which is coupled to a microprocessor and a central processing unit or a multi-chip. Also, a NOR-type flash memory device has the NAND interface mode, being directly coupled to the same buses as the NAND-type flash memory device. And, the NAND-type flash memory device having a SRAM interface mode (an address pin and an input/output pin are separated from each other), is directly coupled to the same buses (e.g., an address bus, a data bus, and a control bus) as the SRAM device. Briefly, the DRAM, SRAM, NAND-type flash memory, and NOR-type flash memory devices have identical interface modes, and are independently (or individually) controlled by a single memory controller. Pin arrangements, structures, and an operating method of memory devices having the identical interface modes are described in detail.

Figure 1:
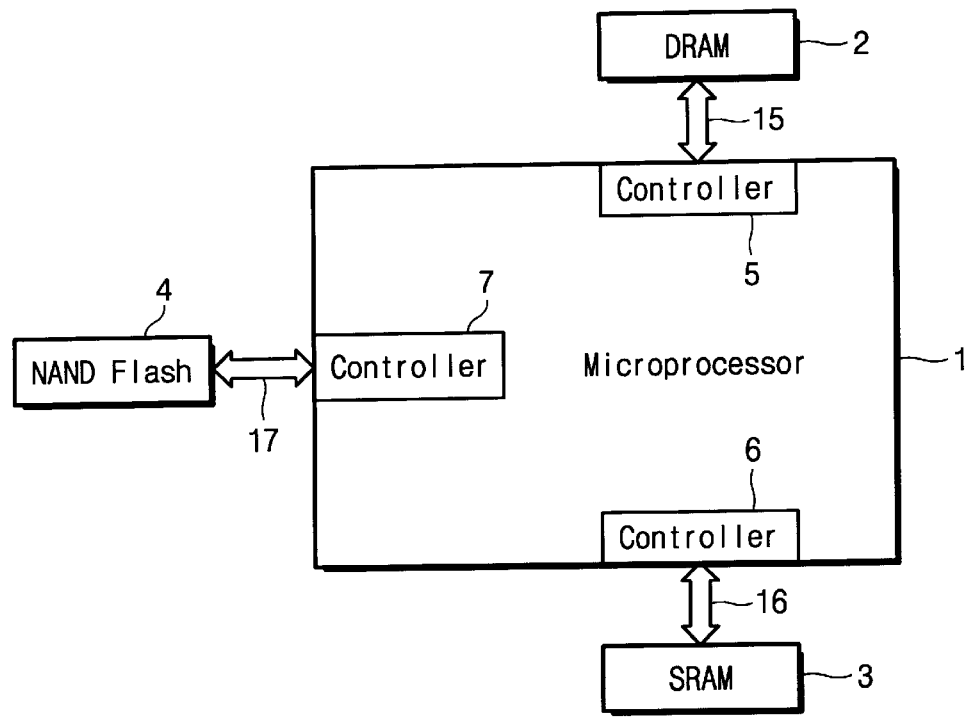
FIG. 1 is a block diagram showing a system configuration in accordance with a prior art.
Figure 2:
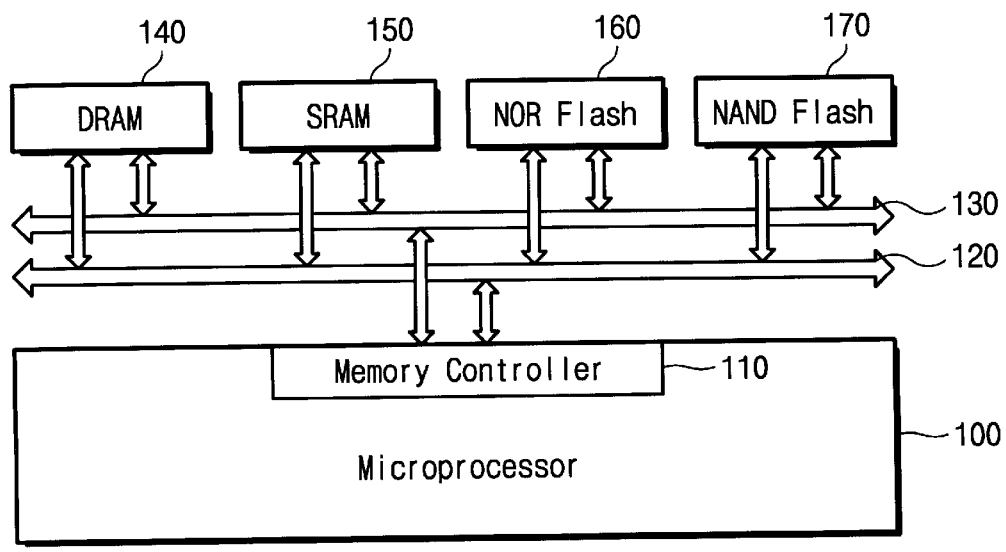
FIG. 2 is a block diagram showing a system configuration in accordance with one embodiment of the present invention.

FIG. 2 schematically shows a construction of a system in accordance with the present invention. A microprocessor 100 includes a memory controller 110, to which there are connected an address/data bus 120 for transferring address and data, and a control bus 130 for transferring a plurality of control signals (e.g., $\overline{CE}$, $\overline{RE}$, $\overline{WE}$, ALE, and CLE).

A DRAM device 140, a SRAM device 150, a NOR-type flash memory device 160, and a NAND-type flash memory device 170 are directly coupled to the buses 120 and 130. The memory devices 140, 150, 160, 170 are actually contained in packages (not shown separately). The packages have pins for connection to external devices. The pins have leads that are attached to leads of the enclosed chip.

Importantly for the present invention, the memory devices 140, 150, 160, 170 have identical interface modes. Specifically, the DRAM device 140, the SRAM device 150, and the NOR-type flash memory device 150 have the NAND interface mode, same as the NAND-type flash memory device 160.

Figure 3:
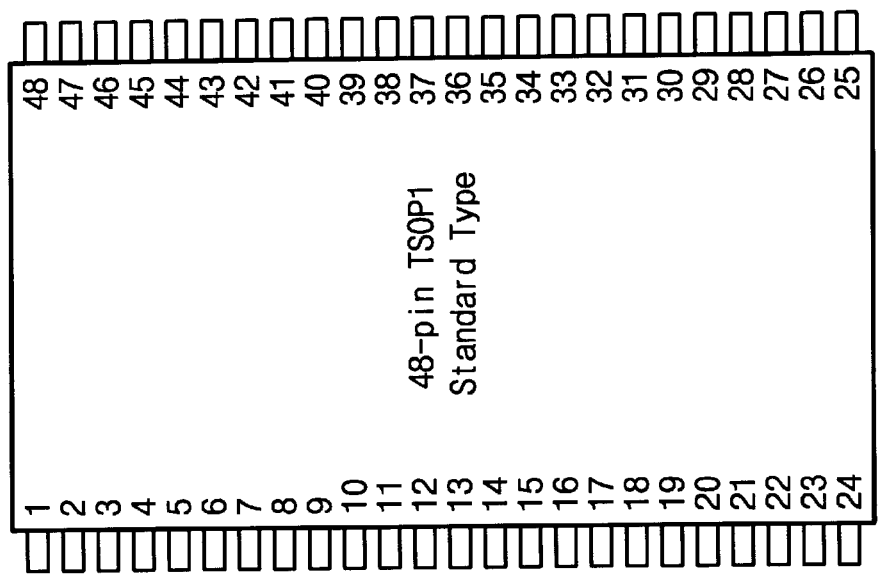
FIG. 3 is a diagram showing pin arrangements of a DRAM, a SRAM, a NOR-type flash memory, and a NAND-type flash memory in accordance with the present invention.

FIG. 3 illustrates pin arrangements of memory devices supporting the NAND interface mode according to embodiments of the invention. Pin arrangements of a 16 Mb DRAM device, an 8 Mb SRAM device, and an 8 Mb NOR-type flash memory device are compared with those of 128 Mb NAND-type flash memory 48-pin TSOP1 package products.

A first group of pins providing memory functions to all memory devices are included in DRAM device 140, SRAM device 150, NOR-type flash memory device 160, and NAND-type flash memory device 170. The pins of the first group include eight input/output pins I/O0–I/O7, two power supply voltage pins VCC, two ground voltage pins VSS, and five function pins, i.e., a chip enable pin $\overline{CE}$ for selecting a corresponding memory device, a read enable pin $\overline{RE}$, a write enable pin $\overline{WE}$, an address latch enable pin ALE, and a command latch enable pin CLE.

As shown in FIG. 3, a second group of three function pins are provided, which are included only in the NOR-type flash memory device 150 and the NAND-type flash memory device 160. The pins of the second group are arranged, corresponding to non-connection (N.C) pins of the DRAM and SRAM devices 140 and 150, commonly connect all the memory devices to the identical buses. That is, a spare array enable pin $\overline{SE}$ is arranged, being located at each 6th pin (N.C) of the memory device 140 and 150. A ready/busy pin $R/\overline{B}$ are arranged, being located at each 7th pin (N.C) of the memory device 140 and 150. A write protect pin $\overline{WP}$ is arranged, being located at each 19th pin (N.C) of the memory device 140 and 150. Out of 48 pins, 28 pins are non-connection (N.C) pins, as can be seen in FIG. 3.

An input of the spare array enable pin $\overline{SE}$ controls spare array selection that is provided to a corresponding flash memory device. An input of the write protect pin $\overline{WP}$ controls write/erase protect that may occur in power transition of $\overline{WP}$. When the input of $\overline{WP}$ is enabled, an internal high voltage generator (not shown) in a memory device is reset. An output of the ready/busy pin $R/\overline{B}$ indicates an operation state of a corresponding flash memory device. When the output of $R/\overline{B}$ is low, it is indicated that program, erase, and read operations of the flash memory device are proceeding.

The memory devices 140, 150, 160, and 170 have pin arrangements that are identical to one another, to be operable in the identical interface mode (specifically, an interface mode of a NAND-type flash memory device). Thus, all the memory devices 140, 150, 160, and 170 are directly coupled to the identical buses (i.e., address/IO bus 120 and control bus 130). Therefore, only one memory controller need be constructed in a microcontroller (or a baseband modem of a communication terminal or a multi-chip that a plurality of devices are constructed in one chip), for controlling operations of all the memory devices 140, 150, 160, and 170. Further, since the memory devices 140, 150, 160, and 170 have pin arrangements that are identical to one another, they can easily be-constructed in a chip-size package.

Figure 4:
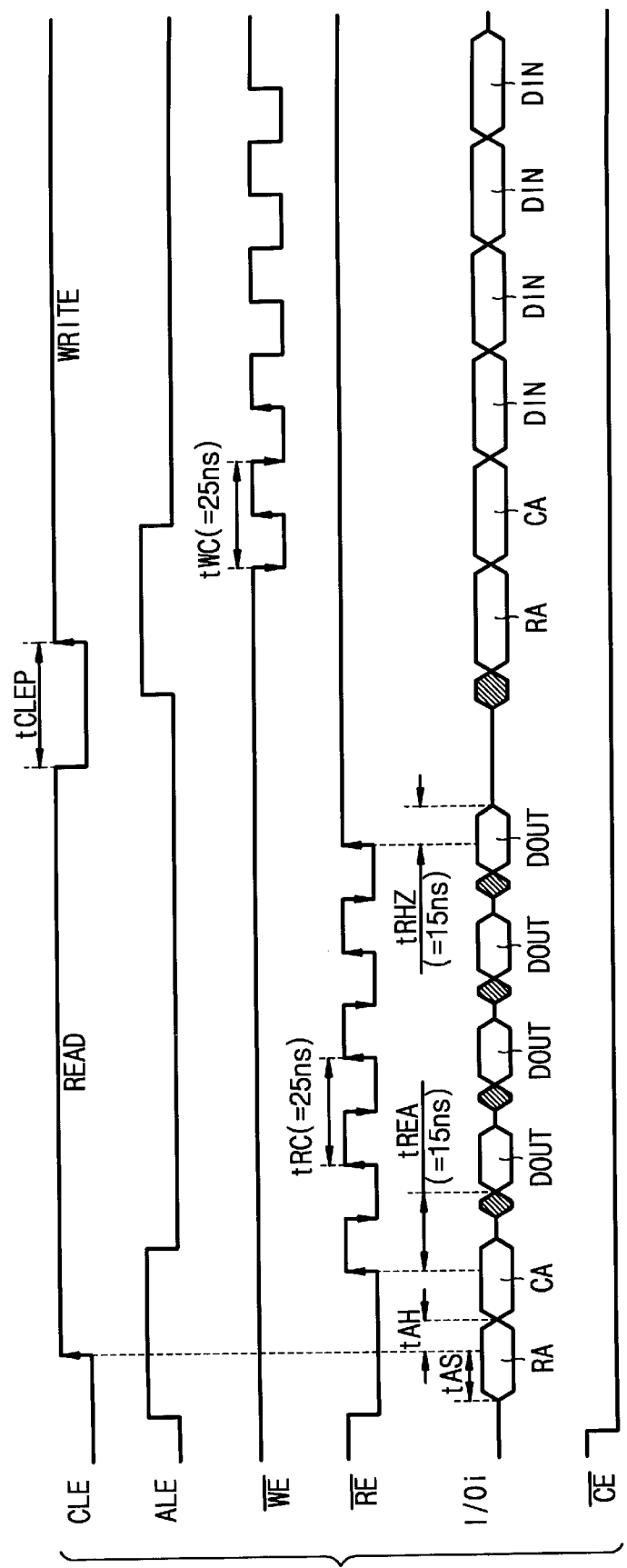
FIG. 4 is a timing diagram showing read and write operations of NAND interface DRAM and SRAM shown in FIG. 2.

FIG. 4 illustrates a timing diagram for describing read/write operations of DRAM and SRAM devices having the foregoing interface mode. Assuming that a chip enable signal $\overline{CE}$ for selecting a DRAM device 140 is enabled, a read operation is as follows. When a command latch enable signal CLE transitions from low level to high level, a row address RA is provided to the DRAM device 140 through input/output pins I/Oi (i=0–7). Then, a column address CA is provided to the DRAM device 140 through I/Oi when a read enable signal $\overline{RE}$ transitions from low level to high level. After a predetermined access time tREA, data read-out from a memory cell array is synchronized with $\overline{RE}$ through I/Oi coupled to an address/data bus 120, being transferred to a bus 120 coupled to a microprocessor 100. The read operation is finished when CLE transitions from high level to low level.

Under the identical assumption, a read operation is performed as follows. When the command latch enable signal CLE transitions from low level to high level again after a row precharge time tCLEP, a row address RA is provided through input/output pins I/Oi (i=1–7). A column address CA is then provided through I/Oi when $\overline{CE}$ transitions from low level to high level. And then, data DIN synchronized with a write enable signal $\overline{WE}$ inputs through data input/output pins I/Oi coupled to the bus 120, and is stored in the memory cell array according to a late write mode that is known in the art.

In FIG. 4, comparing AC characteristic parameters of NAND interface DRAM and SRAM devices with those of conventional DRAM and SRAM devices, the comparison results are shown in the following tables.

TABLE 1

| Conventional DRAM | tCAC | tHPC | tDOH | tRP |
|---|---|---|---|---|
| NI-DRAM | tREA | tRC(tWC) | tRHZ | tCLEP |
| Speed | 15ns | 25(25)ns | 15ns | 30ns |

(NI-DRAM: NAND-Interface DRAM)

TABLE 2

| Conventional SRAM | tACCB | tCLK | tOHZ | tAS/tAH | tACC2 |
|---|---|---|---|---|---|
| NI-SRAM | tREA | tRC(tWC) | tRHZ | tAS/tAH | tACC |
| Speed | 15ns | 25(25)ns | 15ns | 20/0ns | 100ns |

(NI-SRAM: NAND-Interface SRAM)

Read/write operations of a NAND interface SRAM device according to the present invention are also based upon a timing view shown in FIG. 4, so that description thereof will be skipped. The read and write operations of the NAND interface DRAM/SRAM devices are classified using signals $\overline{RE}$ and $\overline{WE}$. For example, the read operation is carried out in moving the read enable signal $\overline{RE}$ while the write operation is carried out in moving the write enable signal $\overline{WE}$.

By the above description, it is known that the command latch enable pin CLS and the read enable pin $\overline{RE}$ substitute for a row address strobe pin $\overline{RAS}$ and a row address strobe pin $\overline{CAS}$ of the conventional DRAM device. Since address and data are provided through the identical input/output pins, collision between an output of read-out data by a first address and an input of a second address may occur in consecutive read operations. In order to overcome the collision, an address (i.e., burst address) for the consecutive read operations is provided into a NAND interface DRAM device. The burst address is created using a burst counter that is well known in the art, and is driven by the read enable signal $\overline{RE}$. A refresh operation of the NAND interface DRAM may be carried out using the command latch enable signal CLE and the read enable signal $\overline{RE}$. For example, an ROR refresh (/RAS only refresh) of a conventional DRAM device is carried out using CLE, and a CBR refresh (/CAS before /RAS refresh) is carried out using CLE and $\overline{RE}$.

In the NAND interface SRAM device, $\overline{RE}$ is used as a signal $\overline{ADV}$ for controlling creation of a burst address in a bust address counter of a conventional SRAM device, and as an output enable signal $\overline{OE}$. For example, when $\overline{ADV}$ is enabled, the burst address counter internally creates a series of burst addresses using an initial address. When $\overline{OE}$ retains low level, data read out from a memory cell array of a NAND interface SRAM device is outputted through data input/output pins I/Oi. The NAND interface SRAM device of this invention uses a second-inputted address out of addresses that are inputted in twice, as a burst address.

Figure 5:
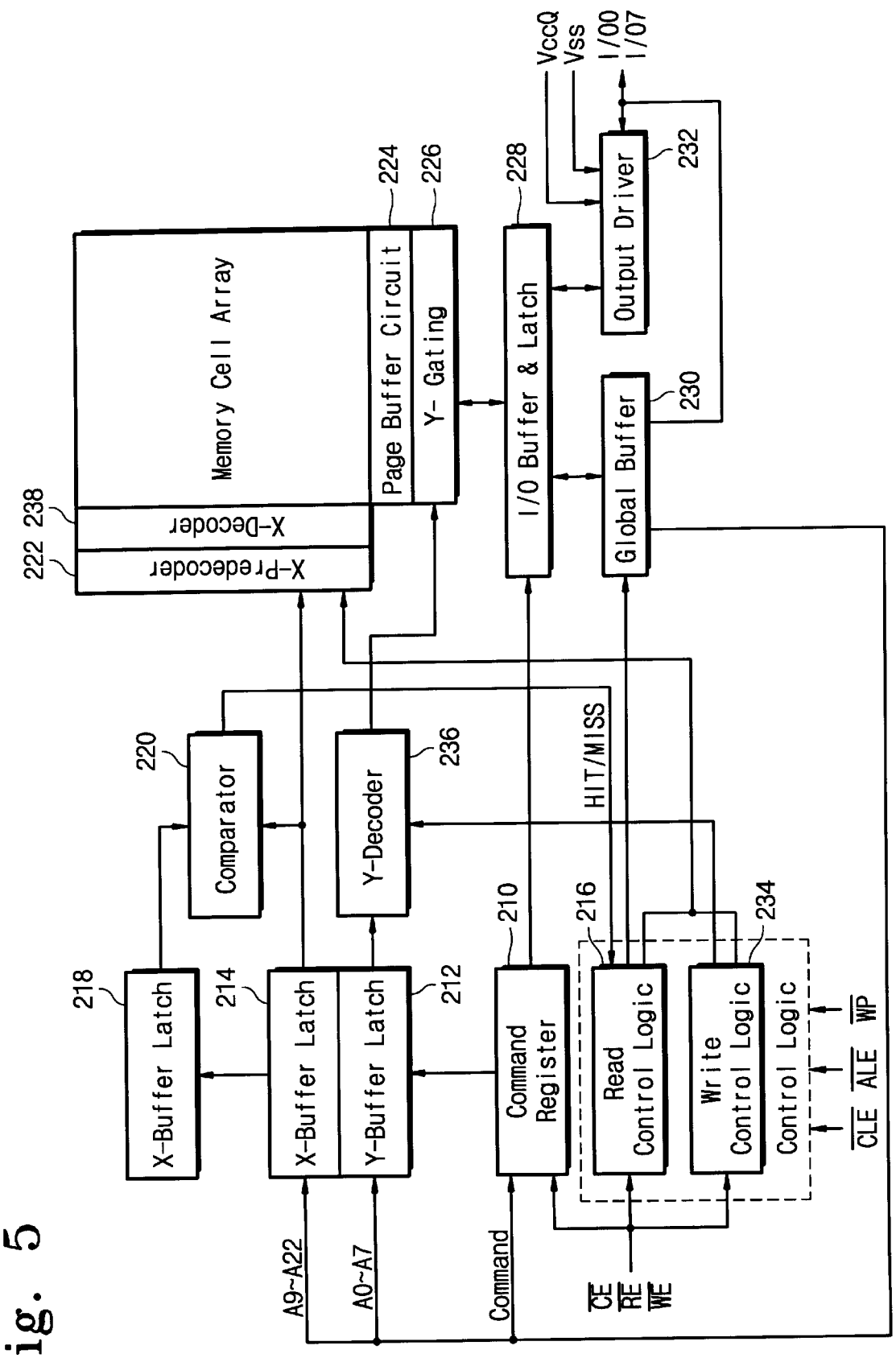
FIG. 5 is a block diagram showing a NAND-type flash memory device shown in FIG. 2.
Figure 6:
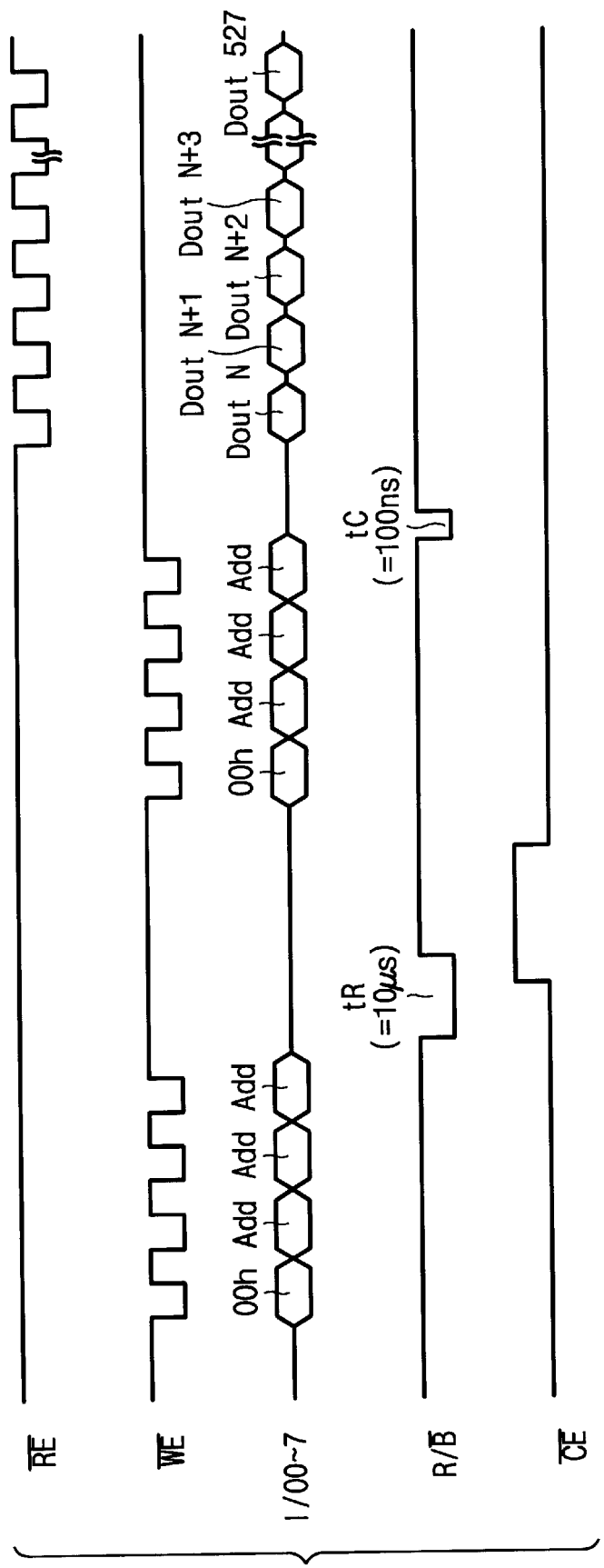
FIG. 6 is a timing diagram showing a read operation of a NAND-type flash memory device shown in FIG. 5.

A NAND flash memory device of this invention is schematically shown in FIG. 5, and an operation timing diagram for describing a read operation is shown in FIG. 6. With reference to FIG. 6, the read operation will now be described more fully hereinafter.

Referring to FIG. 5, a command 00h, inputted through input/output pins I/Oi (i=0–7) to indicate a read operation, is transferred to a command register 210. Consecutively, column addresses A0–A7 and page (row) addresses A8–A16 and A17–A23 are latched to a Y-buffer latch 212 and an X-buffer latch 214, respectively. Based upon control of a read control logic 216, a ready/busy signal R/$\overline{B}$ retains low level for a predetermined time, so as to carry out a practical read operation (i.e., data stored in memory cells of a selected row is latched to a page buffer circuit). A NAND-type flash memory device is unselected, so as to carry out a read/write operation of other memory device (i.e., a chip enable signal $\overline{CE}$ corresponding to the NAND-type flash memory device transitions from low level to high level).

If the read/write operation of other memory device is completed and the chip enable signal $\overline{CE}$ for selecting the NAND-type flash memory device has a high-to-low transition, the command 00h, a column address, and a page address are transferred to a command register 210, a Y-buffer latch 212, and an X-buffer latch 214, respectively. At this time, a previous page address latched to the X-buffer latch 214 is transferred to an X-buffer latch 218. And, a comparator 220 compares whether the latched address to the X-buffer latches 214 and 218 are matched with each other, outputting a signal HIT/MISS as a comparison result. In response to, for example, a high-level signal HIT/MISS indicating that two addresses are matched with each other, a read control logic 216 controls a sensing operation associated with a currently inputted address (i.e., an address latched to the X-buffer latch 214 ) not to be carried out. For example, an X-predecoder 222 is disabled by the read control logic 216.

16. The data, which is latched to a page buffer circuit 224 by a sensing operation that is previously carried out, is then transferred to a bus 120 through the input/output pins I/Oi by the control of the read control logic 216.

In such a read operation, when a previously inputted page (row) address is matched with a currently inputted page (row) address, a practical read operation (specifically, sensing operation) is not carried out. And data (corresponding to a previously inputted page) latched to the page buffer circuit 224 is outputted to the outside, as data required to a current read operation. As shown in FIG. 6, a time tC (e.g., 100 ns) required in the current read operation is shorter than a time tR (e.g., 10 µs) required in a previous read operation. Therefore, other memory device can uses the identical buses (to which an SRAM, a DRAM, a NOR-type flash memory, and a NAND-type flash memory are coupled) for a shortened time. This leads to enhancement of bus use efficiency of memory devices that are established by a common interface mode.

Figure 7:
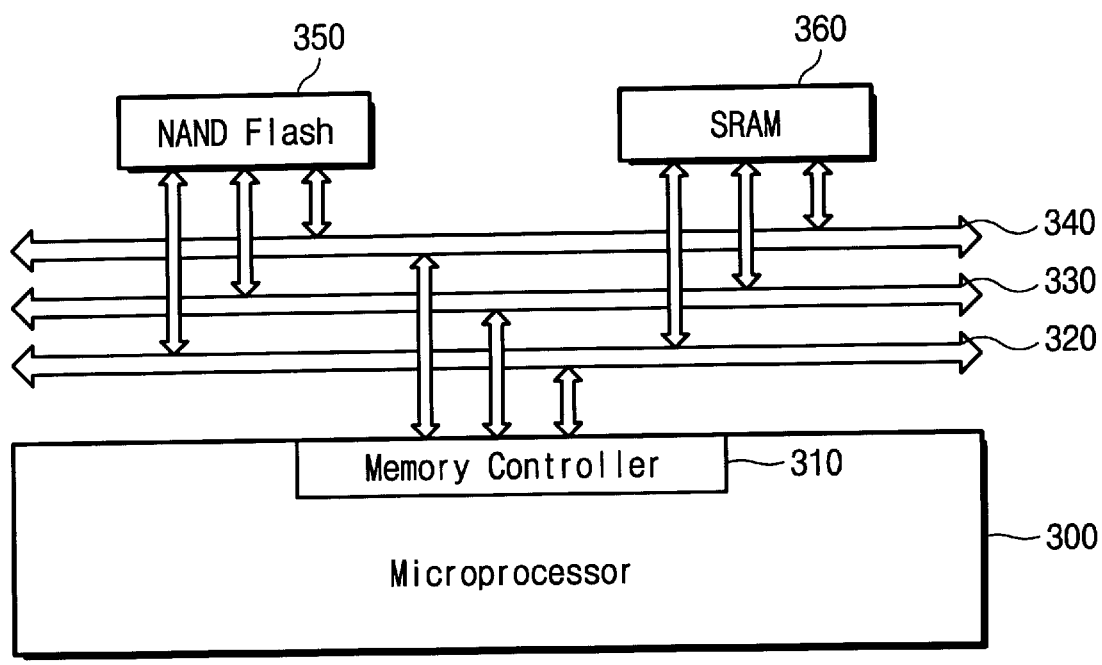
FIG. 7 is a block diagram showing a system configuration in accordance with another embodiment of the present invention.

A system configuration according to another embodiment is schematically shown in FIG. 7. A microprocessor 300 includes a memory controller 310 that generates a control signal for controlling an operation of a memory device and address signals. An address bus 320 for transferring an address, a data bus 330 for transferring data, and a control bus 340 for transferring control signals are connected to the memory controller 310. A NAND-type flash memory device 350 and an SRAM device 360 are directly coupled to the buses 320, 330, and 340. That is, each memory device has the identical interface mode. Specifically, each memory device has a SRAM interface mode (an address pin and a data pin are separated from each other), directly being coupled to the buses 320, 330, and 340 same as the SRAM device 360.

Figure 8A:
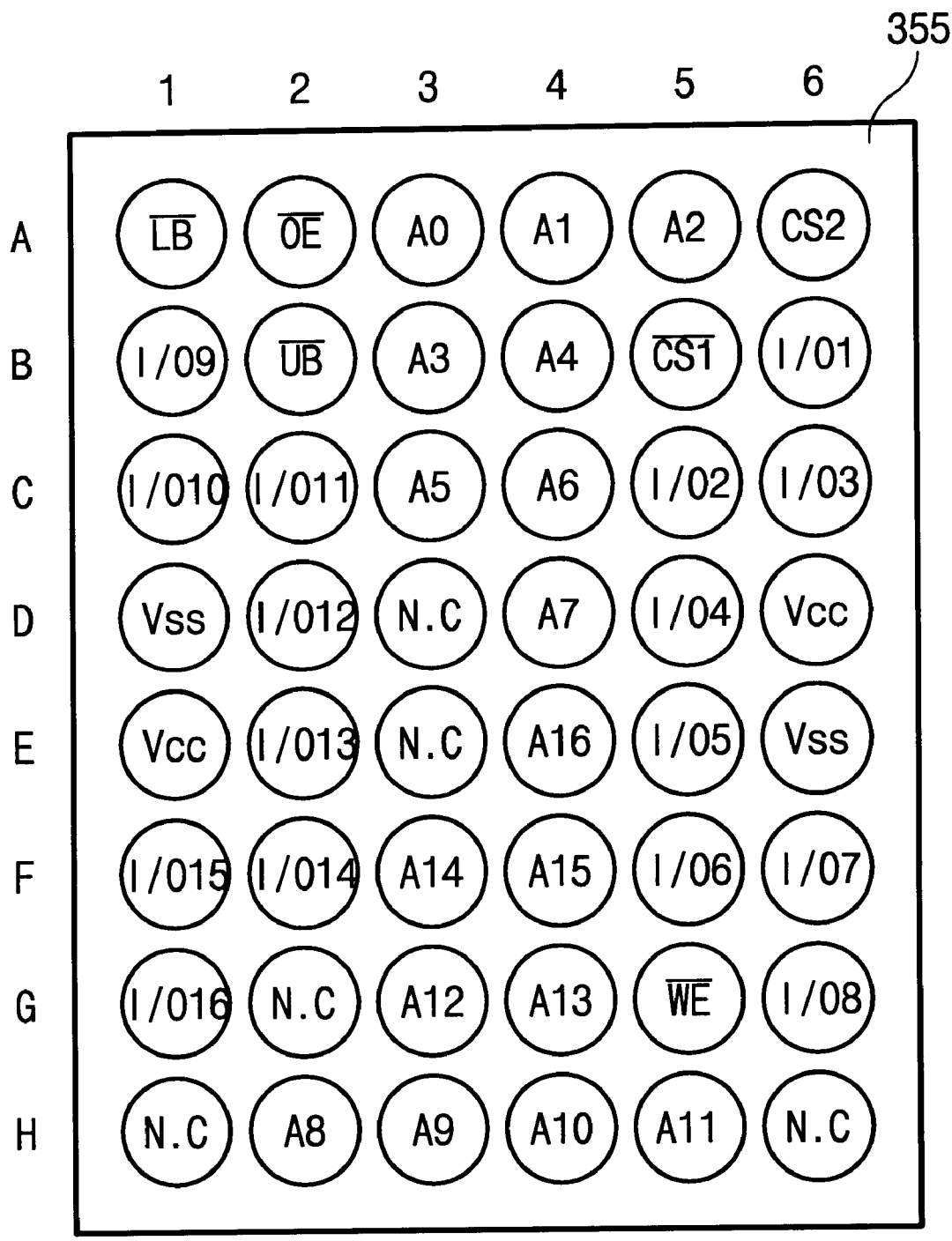
FIG. 8A is a diagram showing a ball pin arrangement of a package for a NAND-type flash memory shown in FIG. 7 according to an embodiment of the invention.
Figure 8B:
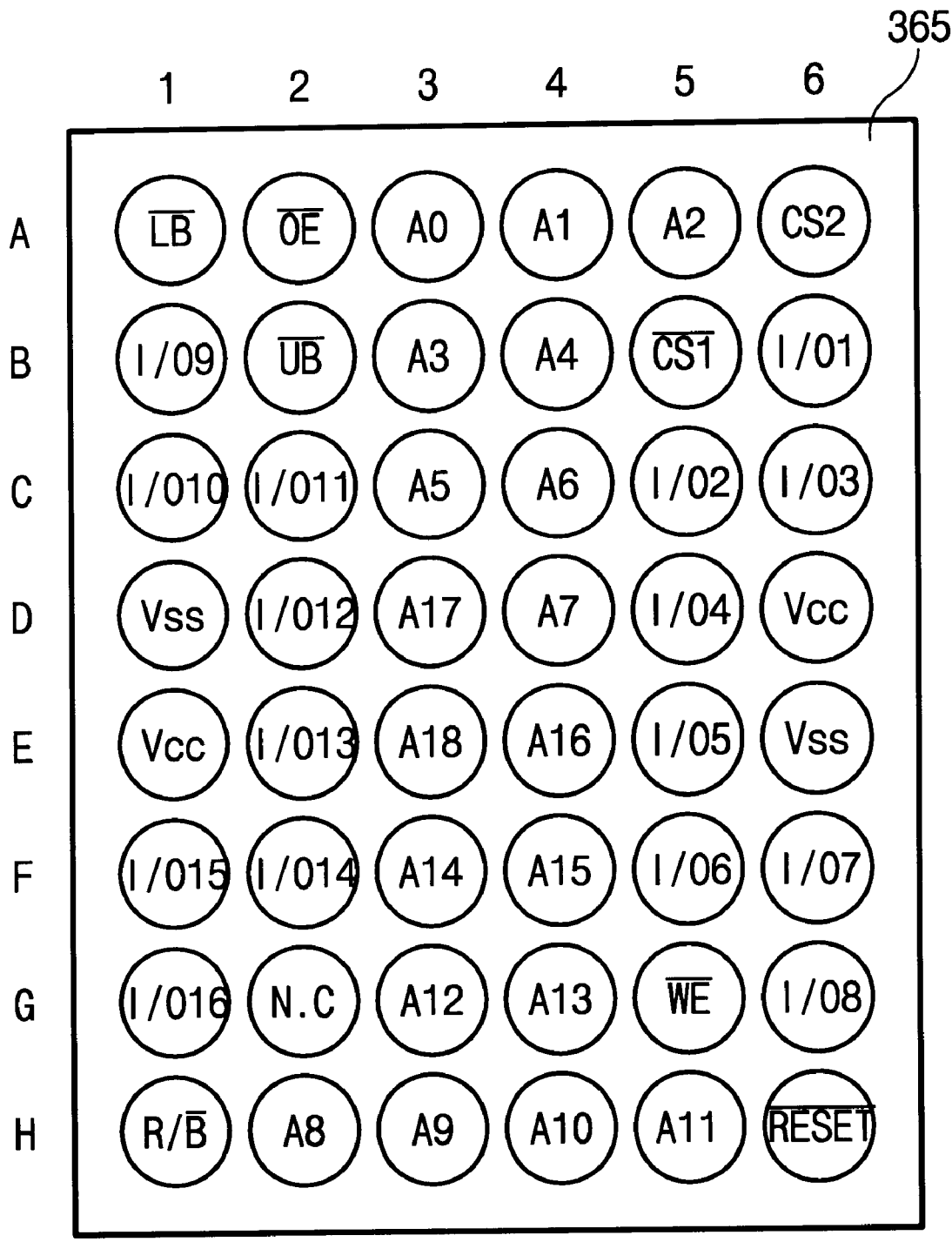
FIG. 8B is a diagram showing a ball pin arrangement of a package for a SRAM shown in FIG. 7 according to an embodiment of the invention.

Referring now to FIG. 8A and FIG. 8B, ball pin arrangements are shown, which accommodate the operation of FIG. 7 according to the invention. More particularly, the ball pin arrangement of a package 355 for a NAND-type flash memory device 350 is explained together with that of an SRAM 48-pin FBGA package 365 product. A first group of pins providing common memory operations to both memory devices are included in a NAND-type flash memory device 350 and an SRAM device 360. The pins of the first group include address pins A0–A16 for receiving an address, input/input pins I/O1–I/O16 for receiving data, two power supply voltage pins VCC, two ground voltage pins VSS, and six function pins. The six function pins include of chip selection pins CS2 and $\overline{\text{CS1}}$ for selecting a corresponding memory device, an output enable pin $\overline{\text{OE}}$, a write enable pin $\overline{\text{WE}}$, a pin $\overline{\text{LB}}$ for selecting data bits of a lower byte, and a pin $\overline{\text{UB}}$ for selecting data bits of an upper byte.

Referring back to FIG. 8B, two function pins are provided which compose a second group of pins included only in the SRAM memory device 360. The pins of the second group are arranged, corresponding to non-connection (N.C) pins of an SRAM device. That is, a ready/busy pin R/$\overline{\text{B}}$ is arranged, being situated at a 1H pin of the SRAM device 360. A hardware rest pin $\overline{\text{RESET}}$ is arranged, being situated at a 6H pin of the SRAM device 360. And, the NAND-type flash memory device 350 further includes address pins A17 and A18 that are arranged, being situated at 3D and 3E pins of the SRAM device 360, respectively. Remaining pins out of 48 pins are non-connection (N.C) pins.

These arrangements permit the memory devices 350 and 360 to be commonly coupled to the address, data, and control buses. These enable the operation of FIG. 7.

The NAND-type flash memory device of this invention applies suitable command signals to input/output pins, carrying out page program, block erase, chip erase, and erase interrupt/refresh operations. For example, if a command signal "80h" (FF hexadecimal) is applied to an input/output pin, the NAND-type flash memory device senses the command and carries out a page program operation, as shown in the following [TABLE 3]. Similarly, command signals "FFh", "60h", and "B0h/D0h" enable the NAND-type flash memory device to carry out reset, block erase, and erase interrupt/refresh operations, respectively. If a command signal is not inputted, a read operation is carried out, as a default mode.

TABLE 3

| Mode of Operation | Command Set | |
|---|---|---|
| | First Cycle | Second Cycle |
| Read | Address | |
| Reset | FFh | |
| Page Program | 80h | |
| Block Erase | 60h | D0h |
| Erase Interrupt/Refresh | B0h/D0h | |

Figure 9A:
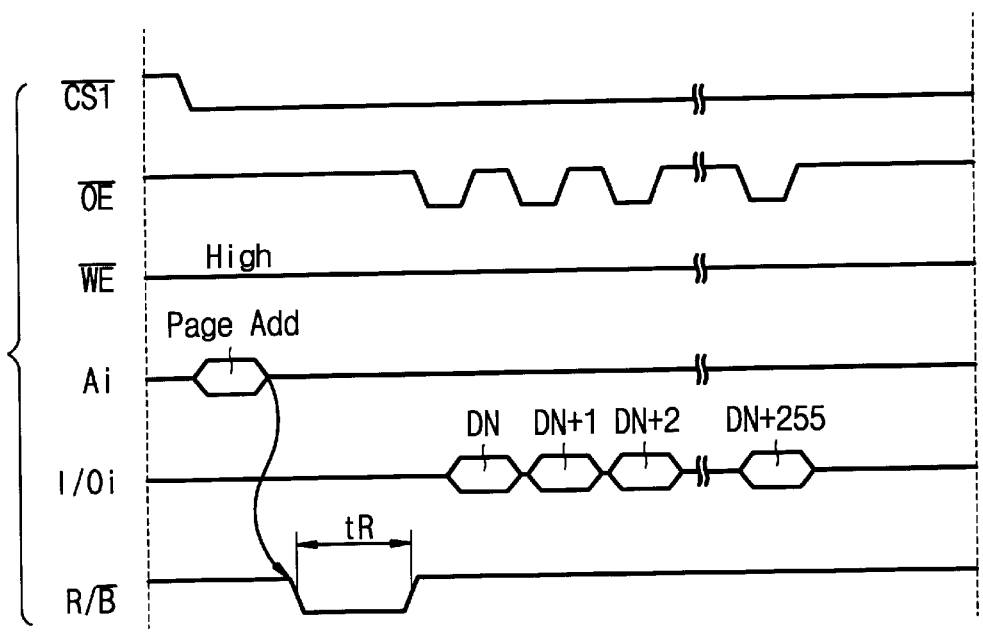
FIG. 9A through FIG. 9C are timing views showing read/program/block erase operations of a SRAM interface NAND-type flash memory device shown in FIG. 8.
Figure 9B:
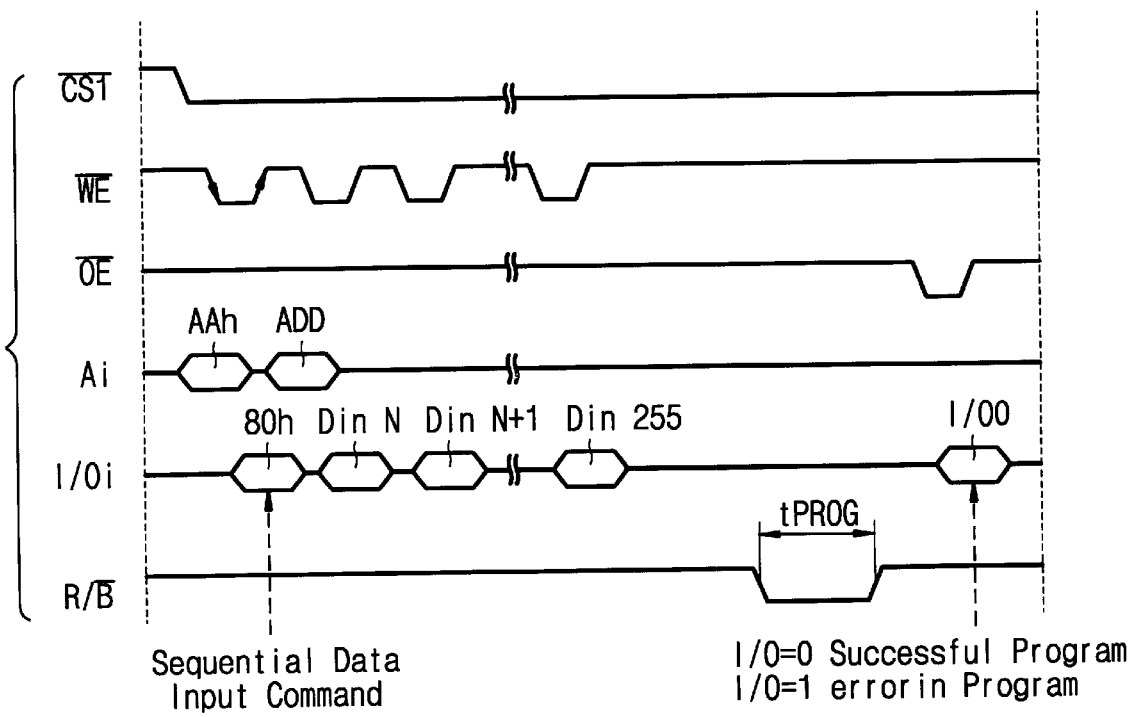
Figure 9C:
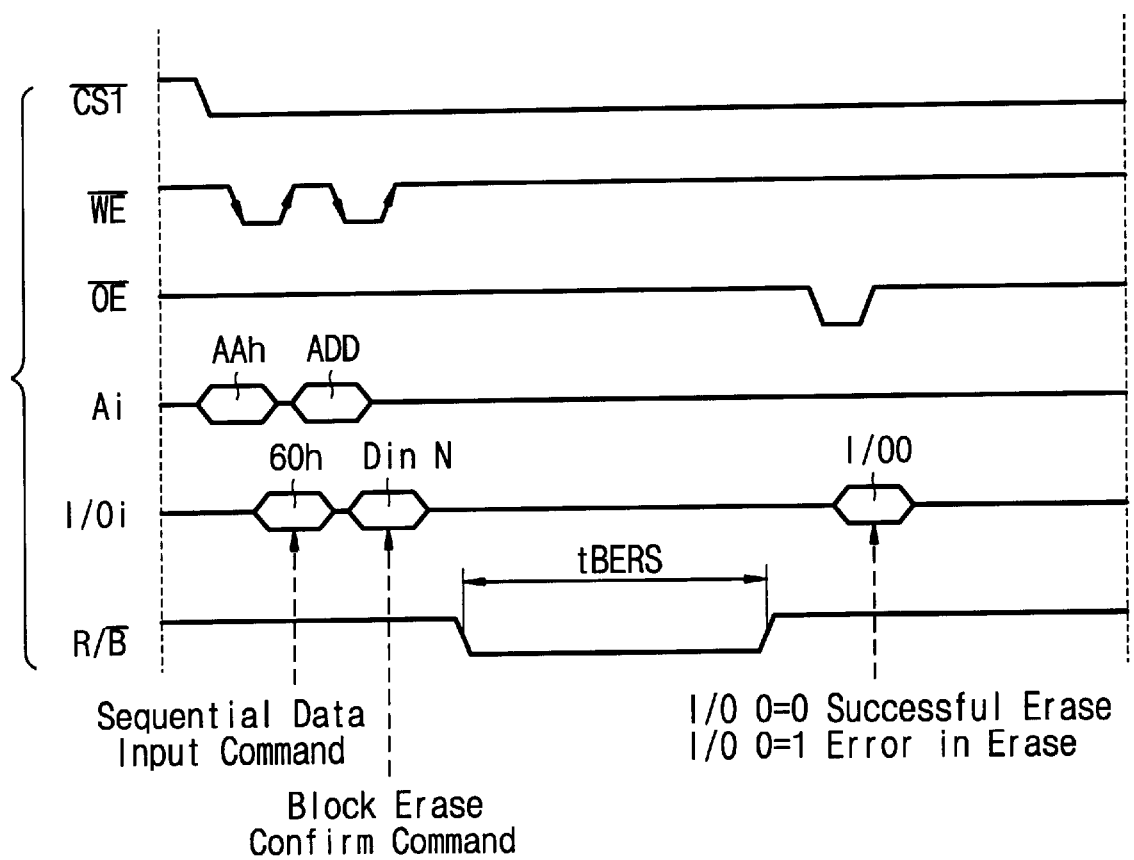

With reference to FIG. 9A through FIG. 9C, read/program/block erase operations of a NAND-type flash memory device having the foregoing common interface mode will be described more fully hereinafter.

As a chip selection signal $\overline{\text{CS1}}$ transitions from high level to low level, a NAND-type flash memory device is selected. Without an input of a command signal, a page address is then applied through address pins Ai, as shown in FIG. 9A. At this time, a ready/busy signal R/$\overline{\text{B}}$ transitions from high level to low level for a predetermined time tR that is needed to carry out a read operation of the NAND-type flash memory device. A conventional page buffer circuit senses and latches data from memory cells of a selected row for the reading time. The latched data is synchronized with an output enable signal $\overline{\text{OE}}$, being outputted to the outside (e.g., a memory controller coupled to a data bus) through input/output pins I/Oi.

Referring now to FIG. 9B, after a high-to-low transition of a chip selection circuit $\overline{\text{CS1}}$, a dummy address command AAh (provided to prevent an unwanted program operation caused by unspecific data), a serial data input command 80h, a column/row address ADD, and a series of data Din are sequentially inputted. A serial data input command 80h and data Din are inputted through input/output pins I/Oi in a low-to-high transition of a write enable signal $\overline{\text{WE}}$. And, the command AAh and address ADD are inputted through address pins Ai in a high-to-low transition of $\overline{\text{WE}}$. As a ready/busy signal R/$\overline{\text{B}}$ retains low level for a predetermined program time tPROG, a practical program operation is then carried out to memory cells. After the program operation, a signal outputted through an input/output pin I/O0 is used as a flag signal that indicates program pass or program fail.

A block erase operation of a NAND-type flash memory device coupled to the same bus as a SRAM is similar to the program operation. Referring to FIG. 9C, on the basis of a falling edge of a write enable signal $\overline{\text{WE}}$, a dummy address command AAh (provided to prevent an unwanted program operation caused by unspecific data) and a block address are inputted. And, on the basis of a rising edge of $\overline{\text{WE}}$, a block erase setup command 60h and a command D0h to confirm a block erase operation are inputted. As a ready/busy signal R/$\overline{\text{B}}$ retains low level for a predetermined erase time tBERS, the block erase operation is then carried out. After the block erase operation, a signal outputted through an input/output pin I/O0 is used as a flag signal that indicates erase pass or erase fail.

As mentioned so far, memory devices provided to a system have pin arrangements that are identical to each other, being operable in the identical interface mode (e.g., an interface mode of a NAND-type flash memory device or an SRAM device). So all the memory devices are

What is claimed is:

1. A semiconductor memory device, comprising:
   a random access memory chip; and
   a package having the random access memory chip,
   wherein the package includes a plurality of pins for electrically connecting the random access memory chip to an external device, and
   wherein the plural pins provide memory functions commonly to a random access memory device and to an electrically erasable and programmable non-volatile semiconductor memory device that includes a NAND-type flash memory device, each of the pins being arranged at a position of a pin corresponding to the non-volatile semiconductor memory device,
   wherein the plural pins are composed of input/output pins for receiving address and data, power supply voltage pins, ground voltage pins, a read enable pin, a chip enable pin, a command latch enable pin, an address latch enable pin, and a write enable pin, and
   wherein the non-volatile semiconductor memory comprises:
   a memory cell array having EEPROM cells in which rows and columns are arranged;
   a first latch circuit for receiving a row address;
   a row selection circuit for selecting at least one of the rows in response to a row address outputted from the first latch circuit;
   a page buffer circuit for reading data stored in cells corresponding to the selected row, and latching the read-out data;
   a second latch circuit for receiving and temporarily storing the latched row address to the first latch circuit;
   a comparator for receiving row addresses each latched to the first and second latch circuits, and comparing whether the row addresses are matched with one another; and a read control logic for controlling an operation of the row selection circuit according to an output signal of the comparator.

2. The device of claim 1 further comprising:
a column selection circuit for selecting a part of the columns in response to a row address; and
output means for outputting the latched data to the page buffer circuit corresponding to the selected columns.

3. The device of claim 2, wherein the read control logic disables the row selection circuit in response to a signal outputted from the comparator when the row addresses are matched with one another, so that the latched data to the page buffer circuit is outputted through the output means without a read operation by the page buffer circuit.

4. The device of claim 1, wherein the first and second latch circuits serve as shift registers.

5. A semiconductor memory device comprising:
an electrically erasable and programmable non-volatile semiconductor memory chip; and
a package having the non-volatile semiconductor memory chip,
wherein the package includes a plurality of pins for electrically connecting the chip to an external device,
wherein the plural chips are composed of a first group of pins and a second group of pins,
wherein the pins of the first group provide memory functions commonly to a static random access memory device and an electrically erasable and programmable non-volatile semiconductor memory device, the pins of the first group each being arranged at a position of a corresponding pin of the static random access memory device, and
wherein the pins of the second group provide functions of unused non-volatile semiconductor memory device to the static random access memory, the pins of the second group each being arranged at a position of an unused pin of the static random access memory.

6. The device of claim 5, wherein the electrically erasable and programmable non-volatile semiconductor memory device includes a NAND-type flash memory device.

7. The device of claim 5, wherein the pins of the first group are composed of address pins, input/output pins, power supply voltage pins, ground voltage pins, a chip selection pin, an output enable pin, and a write enable pin.

8. A semiconductor memory device comprising:
a random access memory chip that is a 8 Mb NOR-type flash memory device; and
a package containing the random access memory chip,
wherein the package includes a plurality of pins for electrically connecting the random access memory chip to an external device, and
wherein the pins provide memory functions commonly to a random access memory device and to an electrically erasable and programmable non-volatile semiconductor memory device, the pins being arranged at positions corresponding to pin positions of the non-volatile semiconductor memory device, and
wherein the pins have a configuration as shown in FIG. 3 of this document.

9. A semiconductor memory device comprising:
a random access memory chip that is one of a 16 Mb DRAM device and 8 Mb SRAM device; and
a package containing the random access memory chip,
wherein the package includes a plurality of pins for electrically connecting the random access memory chip to an external device, and
wherein the pins provide memory functions commonly to a random access memory device and to an electrically erasable and programmable non-volatile semiconductor memory device, the pins being arranged at positions corresponding to pin positions of the non-volatile semiconductor memory device, and the pins have a configuration as shown in FIG. 3 of this document.

10. The device of claim 9, wherein
the pins include input/output pins for receiving address and data, power supply voltage pins, ground voltage pins, a read enable pin, a chip enable pin, a command latch enable pin, an address latch enable pin, and a write enable pin.

11. The device of claim 9, wherein the random access memory chip includes:
a memory cell array having EEPROM cells in which rows and columns are arranged;
a first latch circuit for receiving a row address;
a row selection circuit for selecting at least one of the rows in response to a row address outputted from the first latch circuit;
a page buffer circuit for reading data stored in cells corresponding to the selected row, and latching readout data;
a second latch circuit for receiving and temporarily storing the latched row address to the first latch circuit;
a comparator for receiving row addresses each latched to the first and second latch circuits, and comparing whether the row addresses are matched with one another; and
a read control logic for controlling an operation of the row selection circuit according to an output signal of the comparator.

12. The device of claim 11, wherein the random access memory chip further includes:
a column selection circuit for selecting a part of the columns in response to a row address; and
output means for outputting the latched data to the page buffer circuit corresponding to the selected columns.

13. The device of claim 12, wherein
the read control logic disables the row selection circuit in response to a signal outputted from the comparator when the row addresses are matched with one another, so that the latched data to the page buffer circuit is outputted through the output means without a read operation by the page buffer circuit.

14. The device of claim 11, wherein
the first and second latch circuits serve as shift registers.

15. A semiconductor memory device comprising:
an electrically erasable and programmable non-volatile semiconductor memory chip that is a NAND-type flash memory; and
a package containing the non-volatile semiconductor memory chip,
wherein the package includes a plurality of pins for electrically connecting the chip to an external device,
wherein the pins include a first group of pins and a second group of pins,
wherein the pins of the first group provide memory functions commonly to a static random access memory device and to an electrically erasable and programmable non-volatile semiconductor memory device, the pins of the first group each being arranged at a position of a corresponding pin of the static random access memory device, and wherein the pins of the second group provide functions of unused non-volatile semiconductor memory device to the static random access memory, the pins of the second group each being arranged at a position of an unused pin of the static random access memory.

16. The device of claim 15, wherein the pins have a configuration as shown in FIG. 8A of this document.

17. The device of claim 15, wherein the electrically erasable and programmable non-volatile semiconductor memory chip is a SRAM.

18. The device of claim 17, wherein the pins have a configuration as shown in FIG. 8B of this document.

19. The device of claim 15, wherein the pins of the first group include address pins, input/output pins, power supply voltage pins, ground voltage pins, a chip selection pin, an output enable pin, and a write enable pin.

* * * * *

UNITED STATES PATENT AND TRADEMARK OFFICE
CERTIFICATE OF CORRECTION

PATENT NO.    : 6,456,517 B2
DATED         : September 24, 2002
INVENTOR(S)   : Kim et al.

It is certified that error appears in the above-identified patent and that said Letters Patent is hereby corrected as shown below:

<u>Column 8,</u>
Line 31, after "memory devices are" insert the missing text:

-- directly coupled to identical buses. As a result, a single memory controller need be constructed in a microprocessor (or a baseband modem of a communication terminal, a multi-chip that a plurality of devices are established in one chip, etc.) controlling operations of all the memory devices. Having the identical pin arrangement, the memory devices can be easily implemented in a chip-size package,
        In the drawings an specification, there have been disclosed typical preferred embodiments of the invention and, although specific terms are employed, they are used ina generic and descriptive sense only and not for purpose of limitation, the scope of the invention being set forth in the following claims. --.

Signed and Sealed this

Twenty-ninth Day of April, 2003

JAMES E. ROGAN
*Director of the United States Patent and Trademark Office*